(12) United States Patent
Jiang et al.

(10) Patent No.: US 9,065,001 B2
(45) Date of Patent: Jun. 23, 2015

(54) LIGHT-EMITTING DISPLAY BACKPLANE, DISPLAY DEVICE AND MANUFACTURING METHOD OF PIXEL DEFINE LAYER

(71) Applicant: BOE Technology Group Co., Ltd., Beijing (CN)

(72) Inventors: Chunsheng Jiang, Beijing (CN); Dongfang Wang, Beijing (CN); Haijing Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/078,569

(22) Filed: Nov. 13, 2013

(65) Prior Publication Data

US 2014/0131743 A1    May 15, 2014

(30) Foreign Application Priority Data

Nov. 13, 2012 (CN) .......................... 2012 1 0455346

(51) Int. Cl.
H05B 33/10 (2006.01)
H01L 33/08 (2010.01)
H01L 27/32 (2006.01)

(52) U.S. Cl.
CPC ............ *H01L 33/08* (2013.01); *H01L 27/3246* (2013.01); *H01L 27/3283* (2013.01)

(58) Field of Classification Search
CPC .................................................. H01L 27/3246
USPC .............................................. 257/72; 438/29
See application file for complete search history.

(56) References Cited

U.S. PATENT DOCUMENTS

| | | | |
|---|---|---|---|
| 2005/0057151 A1* | 3/2005 | Kuwabara | 313/506 |
| 2005/0112341 A1* | 5/2005 | Ito et al. | 428/209 |
| 2006/0170338 A1 | 8/2006 | Masuichi et al. | |
| 2010/0102715 A1 | 4/2010 | Suh | |
| 2012/0126268 A1* | 5/2012 | Seo et al. | 257/98 |

FOREIGN PATENT DOCUMENTS

JP          2003-7460 A         1/2003

OTHER PUBLICATIONS

Notification of First Office Action and search report from Chinese Patent Office for priority application 201210455346.1 dated Oct. 23, 2014 with English translation.
Notice of Preliminary Rejection from KoreanIntellectual Property Office for corresponding Korean application 10-2013-0135546 dated Nov. 28, 2014 with English translation.

* cited by examiner

*Primary Examiner* — Thomas L Dickey
(74) *Attorney, Agent, or Firm* — Frommer Lawrence + Haug LLP; Ronald R. Santucci

(57) ABSTRACT

The present invention discloses a light-emitting display backplane, a display device and a manufacturing method of a pixel define layer. A light-emitting display backplane according to the present invention comprises: a substrate and a pixel define layer provided thereon, wherein said pixel define layer comprises: a first photosensitive resin layer, a first transparent define layer and a second transparent define layer sequentially provided on said substrate from bottom to top, each of the first photosensitive resin layer, the first define layer and the second define layer is provided with openings corresponding to respective pixels, and the openings in said second define layer are smaller than those in both said first define layer and said first photosensitive resin layer, so as to form luminescent material filling regions which are wider at bottom and narrower at top.

8 Claims, 3 Drawing Sheets

LIGHT-EMITTING DISPLAY BACKPLANE, DISPLAY DEVICE AND MANUFACTURING METHOD OF PIXEL DEFINE LAYER

FIELD OF THE INVENTION

The present invention relates to the field of display, and particularly, to a light-emitting display backplane, a display device and a manufacturing method of a pixel define layer.

BACKGROUND OF THE INVENTION

An Organic Light Emitting Diode (OLED) and a Polymer Light-emitting Diode (PLED) have particular features such as self-illumination, fast response, wide viewing angle, and being able to be manufactured on a flexible substrate. Thus, a display device based on OLED or PLED is expected to be popular in the field of display in the next few years.

An OLED (or PLED) display backplane includes a substrate, an ITO (Indium Tin Oxide) anode, a light-emitting layer, and a cathode, and its principle of emitting light is: when a voltage is applied, holes and electrons are recombined at the light-emitting layer so as to fall to a lower energy band and release photons whose energy is equal to the energy gap and whose wavelength (color of emitted light) depends on the magnitude of the energy gap of the light-emitting layer.

The light-emitting layer is usually manufactured by printing technique to spread a liquid luminescent material on a specific pixel region. However, size of pixel in existing high resolution products is usually 30 μm×180 μm, while a liquid drop formed by printing has a diameter bigger than 30 μm, which is in a same order of magnitude as the size of the pixel. Therefore, in order to ensure that the printed liquid drops can be successfully and smoothly spread within the pixel region, and meanwhile to avoid a situation that the liquid drops may flow to an adjacent pixel, a pixel define layer (PDL) formed by a double-film structure tends to be applied currently, wherein wider openings are formed in pixel regions in an lower-layer film by means of patterning process, and narrower openings are formed in pixel regions in an upper-layer film by means of patterning process. However, in existing double-layer PDL techniques, two layers of materials are formed separately, and therefore two patterning process are required. As such, the number of masks used is inevitably increased and exposure process is also increased, resulting in enhanced manufacturing oasis, which is unfavorable for mass production.

SUMMARY OF THE INVENTION

An objective of the present invention is to provide a light-emitting display backplane, a display device and a manufacturing method of a pixel define layer, which can ensure that liquid drops of a luminescent material which are formed by printing can be spread within the pixel region, and prevent the liquid drops from flowing into an adjacent pixel region.

In order to realize the above objective, embodiments of the present invention use the following technical solutions:

A light-emitting display backplane, including: a substrate and a pixel define layer provided thereon, wherein, said pixel define layer includes:

a first photosensitive resin layer, a first transparent define layer and a second transparent define layer sequentially provided on said substrate from bottom to top, each of the first photosensitive resin layer, the first define layer and the second define layer is provided with openings corresponding to respective pixels, and the openings in said second define layer are smaller than those in both said first define layer and said first photosensitive resin layer, so as to form luminescent material filling regions which are wider at bottom and narrower at top.

Preferably, said second define layer is formed of a hydrophobic material.

Preferably, said second define layer is a silicon nitride thin film.

Preferably, said first define layer is formed of a hydrophilic material.

Preferably, said first define layer is a silicon oxide thin film.

The present invention also provides a display device, including: any light-emitting display backplane as described above.

Another aspect of the present invention provides a manufacturing method of a pixel define layer of a light-emitting display backplane, said light-emitting display backplane includes a substrate and a pixel define layer provided on said substrate, and said method includes:

sequentially forming a first photosensitive resin layer, a first transparent define layer, a second transparent define layer and a second photosensitive resin layer on said substrate;

providing a mask on said second photosensitive resin layer, wherein said mask has a pattern corresponding to respective pixels;

performing exposure, so that both said second photosensitive resin layer and said first photosensitive resin layer below said second photosensitive resin layer are exposed;

removing resin from regions corresponding to respective pixels in said second photosensitive resin layer, so as to uncover the second define layer;

performing etching, so as to form openings corresponding to respective pixels in both the uncovered second define layer and said first define layer below the second define layer, wherein, during etching, etch rate at which said second define layer is etched is lower than etch rate at which said first define layer is etched, so that the openings in said second define layer are smaller than those in said first define layer.

Furthermore, said method further includes: removing resin from the regions in said first photosensitive resin layer which correspond to respective pixels.

Preferably, said second define layer is formed of a hydrophobic material.

Preferably, said second define layer is a silicon nitride thin film.

Preferably, said first define layer is formed of a hydrophilic material.

Preferably, said first define layer is a silicon oxide thin film.

Optionally, said etching on the uncovered second define layer and the first define layer below the second define layer is performed by means of dry etching.

Optionally, said etching on the uncovered second define layer and the first define layer below the second define layer is performed by means of wet etching, and etch rate of an applied etchant for the silicon nitride is lower than that for the silicon oxide.

The present invention provides the light-emitting display backplane, the display device and the manufacturing method of manufacturing a pixel define layer. First, the first photosensitive resin layer, the first define layer, the second define layer and the second photosensitive resin layer are sequentially formed; a mask is provided above the second photosensitive resin layer, and the mask has the pattern corresponding to respective pixels; exposure amount of photolithography is increased, so that the first and the second photosensitive resin layers are exposed; the second photosensitive resin layer is then removed, and the regions of the first and the second define layers corresponding to respective pixels are etched to form luminescent material filling regions which are wider at bottom and narrower at top due to different etch rates for materials of the first and the second define layers. Such luminescent material filling regions can ensure that liquid drops of the luminescent material can be overspread within the pixel region of the pixel define layer, and be prevented from spattering or flowing into an adjacent pixel region during printing. Moreover, photolithography process only needs to be performed once to realize the pixel define layer, so that the number of masks used is reduced, and the manufacturing cost is lowered.

DESCRIPTION OF REFERENCE NUMERALS

Figure 1:
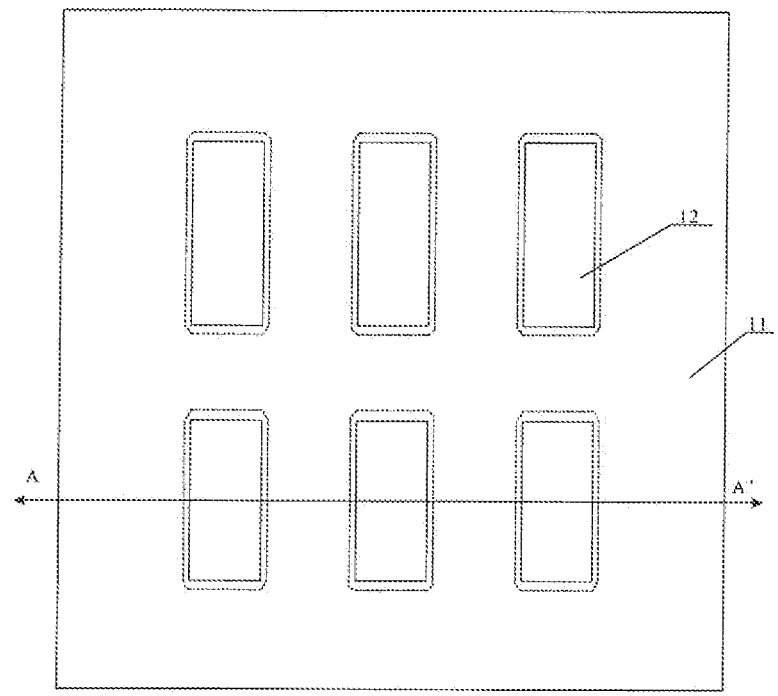
FIG. 1 is a top view of an example of the ht-emitting display backplane provided by the present invention.

10—substrate,
11—pixel define layer
111—first photosensitive resin layer,
112—first define layer,
113—second define layer,
114—second photosensitive resin layer,
12—luminescent material filling region,
13—anode electrode.

DETAILED DESCRIPTION OF EMBODIMENTS

Embodiments of the present invention provide a light-emitting display backplane, a display device and a manufacturing method of a pixel define layer, which can ensure that liquid drops of the luminescent material, which is formed during printing, can be spread within the pixel region of the pixel define layer, and be prevented from flowing into an adjacent pixel region. Moreover, photolithography process only needs to be performed once, so that the number of masks used is reduced, and accordingly the manufacturing cost is lowered.

Embodiments of the present invention will be described in detail with reference to the accompanying drawings below. Specific embodiments described here are illustrative only and are not used to limit the present invention.

It should be noted that, in the following description, terms used to describe positional relationships between the substrate and the pixel define layer and between respective film layers of the pixel define layer refer to the positional relationships shown in FIG. 2, unless otherwise specified. For example, in FIG. 2, a pixel define layer 11 is provided on a substrate 10; the pixel define layer 11 includes a first photosensitive resin layer 111, a first define layer 112 and a second define layer 113 provided thereon from bottom to top. Directional terms such as "on", "below" and the like are only used for easy of descriptions rather than for limitation, and the directional terms regarding positional relationships may vary according to reference position and direction.

Embodiment 1

An embodiment of the present invention provides a light-emitting display backplane. As shown in FIGS. 1 and 2, the backplane includes: a substrate 10 and a pixel define layer 11 provided on the substrate 10, said pixel define layer 11 includes:

a first photosensitive resin layer 111, a first transparent define layer 112 and a second transparent define layer 113 are sequentially provided on the substrate 10 from bottom to top;

Each of the first photosensitive resin layer 111, the first define layer 112 and the second define layer 113 is provided with openings corresponding to respective pixels, and the openings of the second define layer 113 are smaller than those of both the first define layer 112 and the first photosensitive resin layer 111, so as to form luminescent material filling regions 12 which are wider at bottom and narrower at top.

An OLED (or PLED) light-emitting display backplane includes a substrate, an ITO (indium Tin Oxide) anode, a light-emitting layer and a cathode. Wherein, when forming the light-emitting layer, for the OLED or PLED backplane, especially for the display backplane with high resolution, sizes of liquid drops of luminescent material formed through printing techniques are in a same order of magnitude as those of backplane pixels. Thus, the printing are required to be very accurate, however the liquid drops would inevitably deviate during printing, which causes defects such as RGB color crosstalk and Mura. To avoid the above defects, according to the embodiment, the pixel define layer 11 is first provided, and then the luminescent material is fed into pixel regions of the pixel define layer 11 by means of printing. Specifically, in the embodiment, three layers of materials are used to form the pixel define layer (PDL) for the organic luminescent material in the pixels, and the specific structure of the PDL includes: the first photosensitive resin 111 as the bottom layer, the first define layer 112 above the first photosensitive resin 111, and the second define layer 113 as the top layer.

The pixel define layer 11 according to the embodiment is provided on a substrate formed with an anode electrode 13 (e.g. ITO anode), and said pixel define layer 11 is provided with luminescent material filling regions 12. Specifically, each of the first photosensitive resin layer 111, the first define layer 112 and the second define layer 113 is provided with openings corresponding to respective pixels, and the openings in the first photosensitive resin layer 111 and the first define layer 112 are bigger, while the openings in the second define layer 113, which is the top layer, are smaller. That is, diameter l of the opening in the second define layer 113 is smaller than diameter L of the opening in the first define layer 112, so as to form the luminescent material filling regions 12 which are wider at bottom and narrower at top.—Thus, once a liquid drop of the luminescent material falls or flows into a region, it will be uneasy to flow out.

In the embodiment, the luminescent material filling region 12 has a bigger bottom area and a smaller top opening, which facilitates filling of the luminescent material, so as to ensure that during printing, the liquid drops of the luminescent material can be overspread within the pixel region of the pixel define layer, and be kept from flowing into an adjacent pixel region. Further, as described below, photolithography process only needs to be performed once to form the pixel define layer 11 (referring to Embodiment 2), so that the number of masks used is reduced, and the manufacturing cost is accordingly lowered.

Wherein, preferably, the second define layer 113 as an upper layer is formed of a hydrophobic material, such as silicon nitride. It should be noted that the hydrophobic material here refers to a material which is repelled by the liquid drops of the luminescent material.

When the liquid luminescent material drops onto a surface of the pixel define layer 11, it is required to from liquid drops. Thus, the liquid drops can be formed and flow into the luminescent material filling region 12 when the printing deviates from the pixel region. Whether or not the luminescent material can form liquid drops on the surface of the pixel define layer 11 depends on the surface wetting characteristic of the luminescent material on the surface of the pixel define layer 11, and essentially depends on the surface energy of the pixel define layer 11.

Since existing luminescent materials are generally hydrophilic, the top layer (i.e. the second define layer 113) of the pixel define layer 11 of the embodiment is formed of a hydrophobic material. In this case, when the printing deviates from the pixel region, the luminescent material can form liquid drops which then flow into the luminescent material filling region 12. Therefore surface treatments is not required to be formed on the pixel define layer 11, and there is no need to increase equipment investment. Thus the cost is lowered, which favors mass production.

Preferably, the first define layer 112 as a lower layer is formed of a hydrophilic material, such as silicon oxide.

The first define layer 112 is formed of a hydrophilic material, and usually luminescent materials are also hydrophilic. In this case, when the liquid drops of the luminescent material fall or flow into the luminescent material filling region 12, the first define layer 112 formed of a hydrophilic material can facilitate spreading of the liquid drops of the luminescent material, such that the liquid drops of the luminescent material can evenly overspread the pixel region, and thus improving light-emitting quality of the light-emitting display backplane.

As a preferable embodiment, the second define layer 113 is a silicon nitride thin film ($SiN_x$, wherein the value of x is 1~4/3) whose reference thickness is 200~300 nm; the first define layer 112 is a silicon oxide thin film ($SiO_x$, wherein the value of x is 1~2) whose reference thickness is also 200~300 nm.

In the present invention, the pixel define layer 11 usually has a certain thickness (such as 1.5 μm~20 μm) which is guaranteed by the presence of the first photosensitive resin layer 111. Without the first photosensitive resin layer 111, the first define layer (SiOx) 112 and the second define layer (SiNx) 113 will be excessive thick, and thus leading to microcracks.

Obviously, the embodiment does not exclude a case where the luminescent material is a hydrophobic material. In this case, preferably, the second define layer 113 as an upper layer is formed of a hydrophilic material, and the first define layer 112 as a lower layer is formed of a hydrophobic material.

As to the light-emitting display backplane according to an embodiment of the present invention, as the pixel define layer provided thereon can ensure that during printing of the luminescent material, the liquid drops of the luminescent material can be spread within the pixel of the pixel define layer and kept from flowing into an adjacent pixel region. As such, the light-emitting quality of the light-emitting display backplane is improved, and the defects of the display such as RGB color crosstalk and Mura are avoided. Moreover, the manufacturing process of the pixel define layer is simple, and therefore the cost is lowered, which favors mass production.

Embodiments of the present invention also provide a display device, comprising any of the above light-emitting display backplanes, which can improve the light-emitting quality, avoid the defects such as RGB color crosstalk and Mura, and simplify the manufacturing process. Thus the cost is lowered, which favors mass production.

Said display device may be any product or component which has a displaying function, such as an OLED panel, electronic paper, cell phone, a tablet computer, television set, display, laptop, digital photo frame, navigating instrument, and so on.

Embodiment 2

Figure 3:
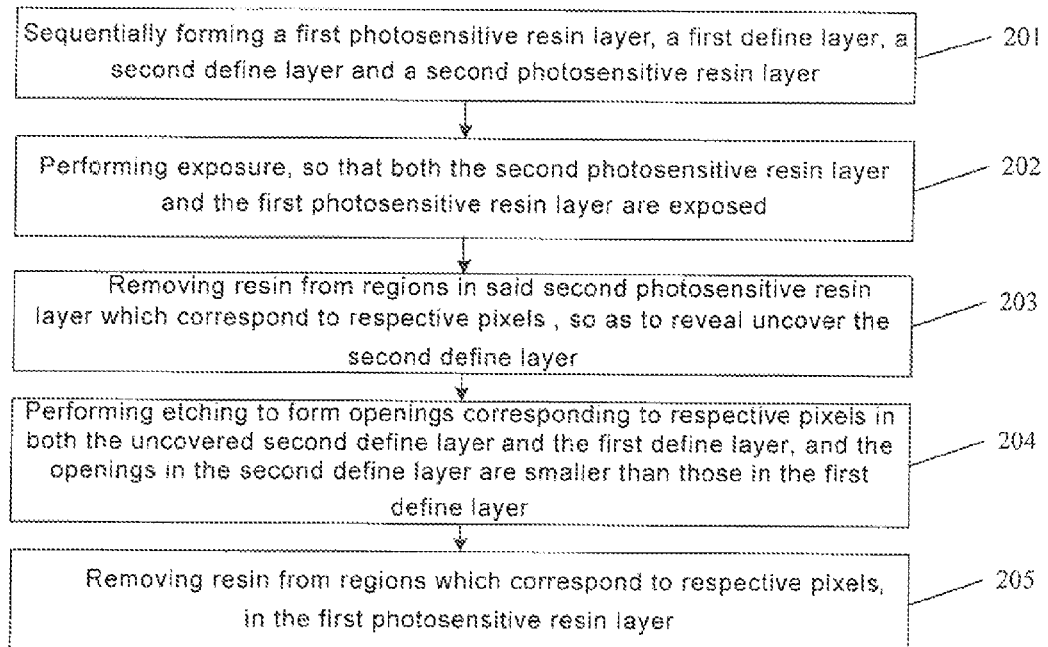
FIG. 3 is a flow chart of a manufacturing method of a pixel define layer of a light-emitting display backplane provided by the present invention.

The present invention provides a manufacturing method of a pixel define layer of a light-emitting display backplane. Said light-emitting display backplane includes a substrate and a pixel define layer provided on said substrate, as shown in FIG. 3, and the method includes steps as described below.

Figure 4:
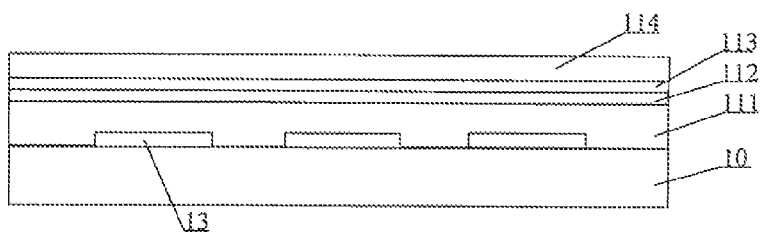
FIG. 4 is a schematic diagram illustrating respective films formed during manufacturing a pixel define layer as provided by the present invention.

In step 201, a first photosensitive resin layer 111, a first define layer 112, a second define layer 113 and a second photosensitive resin layer 114 are sequentially formed on said substrate, wherein both said first define layer 112 and the second define layer 113 are transparent, such that light from an exposure light source (such as UV light) can pass through the first define layer 112 and the second define layer 113, and then reach the first photosensitive resin layer 111, as shown in FIG. 4.

In this step, a method for forming (or manufacturing) the first photosensitive resin layer 111, the first define layer 112, the second define layer 113 and the second photosensitive resin layer 114 may be a physical vapor deposition (PVD) method, such as evaporation, sputtering, ion plating, and so on, and also may be a chemical vapor deposition (CVD) method. Generally, the method is selected according to the material of the thin film to be deposited, and is not limited in the embodiment. In the following, a case in which the first define layer 112 is a silicon oxide thin film and the second define layer 113 is a silicon nitride thin film is taken as an example to illustrate the specific manufacturing solutions. A specific manufacturing solution provided by an embodiment of the present invention is as follows.

After a backplane is laminated with gate-gate insulating layer-active layer-source/drain-passivation layer (forming a thin-film transistor with, for example, a bottom gate structure), a layer of ITO is deposited as the material of an anode, and is etched to form anode electrodes 13 of respective pixels.

A layer of photosensitive resin material (a first photosensitive resin layer 111) whose reference thickness is 800 nm~1000 nm is spin coated on the ITO;

A $SiO_x$ thin film is deposited as a first define layer 112 with a reference thickness of 200 nm~300 nm on the photosensitive resin using Chemical Vapor Deposition (such as PECVD) or atmospheric pressure RF cold plasma (such as TEOS).

A layer of $SiN_x$ is deposited on the $SiO_x$ using the same deposition technique as above to obtain a second define layer 113 whose reference thickness is 200 nm~300 nm. Preferably, the thickness of the second define layer 113 is smaller than that of the first define layer 112.

Another layer of photosensitive resin material the second photosensitive resin layer 114) is pin coated on the layer of SiN$_x$, for exposing and etching of patterns in a next step. In step 202, a mask is arranged above the second photosensitive resin layer, and the mask has a mask pattern corresponding to respective pixels.

Figure 5:
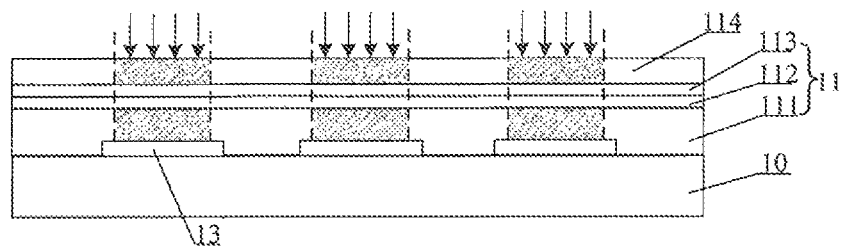
FIG. 5 is a schematic diagram illustrating exposure in respective films during manufacturing the pixel define layer as provided by the present invention.

In step 203, exposure is performed so that both the second photosensitive resin layer 114 and the first photosensitive resin layer 111 are exposed, as shown in FIG. 5.

In this step, exposure amount of photolithography is increased, and since both the first define layer 112 (for example, a SiO$_x$ thin film) and the second define layer 113 (for example, a SiN$_x$ thin film) are transparent, the second photosensitive resin layer 114 and the first photosensitive resin layer 111 above the ITO anode electrode 13 are exposed, as shown in FIG. 5.

The second photosensitive resin layer 114 may be made of a positive photosensitive material or a negative photosensitive material. When a positive photosensitive material is used, transparent regions of the mask correspond to respective pixels, and regions of both the second photosensitive resin layer 114 and the first photosensitive resin layer 111 which correspond to respective pixels are accordingly exposed; when a negative photosensitive material is used, opaque regions of the mask correspond to respective pixels, and regions other than the regions corresponding to respective pixels, of both the second photosensitive resin layer 114 and the first photosensitive resin layer 111 are accordingly exposed.

Figure 6:
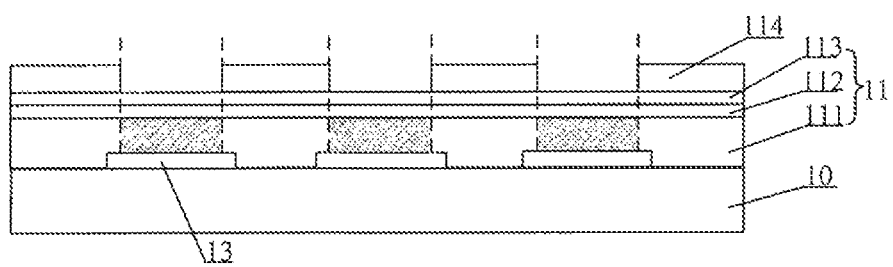
FIG. 6 is a schematic diagram illustrating a pixel define layer after an exposed second photosensitive resin layer is removed during manufacturing the pixel define layer as provided by the present invention.

In step 204, resin in the regions of the second photosensitive resin layer 114 which correspond to respective pixels is removed, so as to uncover the first define layer 113, and thus forming a structure as shown in FIG. 6.

In this step, the resin in the regions corresponding to respective pixels, of the second photosensitive resin layer 114 (the uppermost PR) is wash off by using a developer.

Figure 7:
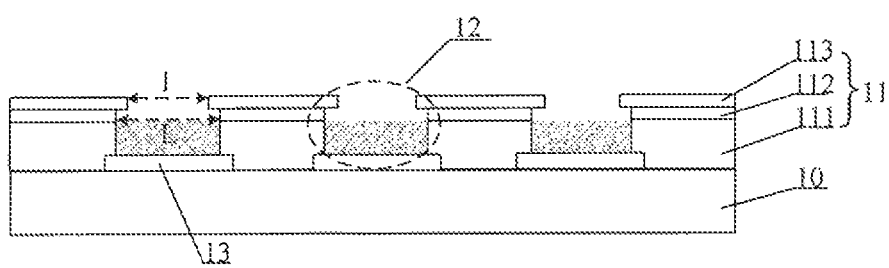
FIG. 7 is a schematic diagram illustrating a pixel define layer after being etched during manufacturing the pixel define layer as provided by the present invention.

In step 205, etching is performed, so as to form openings corresponding to respective pixels, in both the uncovered second define layer 113 and the first define layer 112, wherein, during etching, etch rate for the second define layer 113 is lower than that for the first define layer 112, such that the openings in the second define layer 113 are smaller than those in the first define layer 112, as shown in FIG. 7.

In this step, different etch rates are realized by utilizing different sensitivities of different materials against an etchant/ion beam. In practice, a method in which the etch rate for the second define layer 113 is lower than that for the first define layer 112 is selected.

Specifically, taking a case in which the first define layer 112 is a silicon oxide thin film and the second define layer 113 is a silicon nitride thin film as an example: optionally, dry etching is used to etch the uncovered silicon nitride SiN$_x$ thin film (the second define layer 113) and the silicon oxide SiO$_x$ thin film (the first define layer 112). Since the etch rate for the SiN$_x$ thin film is much slower than that for the SiO$_x$ thin film and lateral etching phenomenon occurs in the SiN$_x$ thin film, under same etching conditions, the openings in the SiN$_x$ thin film are smaller than those in the SiO$_x$ thin film. Here, dry etching includes but is not limited to sputtering and ion milling, plasma etching, high pressure plasma etching, high density plasma (HOP) etching and reactive ion etching (RIE). Or, alternatively, wet etching may also be used to etch the uncovered silicon nitride thin film (the second define layer 113) and the silicon oxide thin film (the first define layer 112), wherein etchant which has a lower etch rate for silicon nitride and a faster etch rate for silicon oxide is selected. Finally, a stripper is further used to peel off residual second photosensitive resin layer 114, and obviously other methods may be used.

Figure 2:
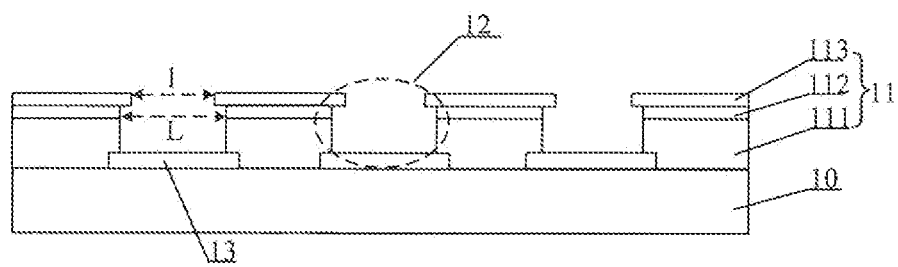
FIG. 2 is a schematic diagram of cross-sectional structure taken along direction of A-A' of the light-emitting display backplane shown in FIG. 1.

Furthermore, said method further includes step 206, wherein resin in regions corresponding to respective pixels, in the first photosensitive resin layer 111 is removed, so as to form the pixel define layer 11 as shown in FIG. 2.

In this step, a developer is used to peel off the resin in the regions of the first photosensitive resin layer 111 which correspond to respective pixels. However, specific embodiments are not limited hereto and may apply other methods.

In embodiments of the present invention, the order number of each step is not used to limit the order of each step. Changes made on the order of each step by the person skilled in the art without creative efforts also fall into the protection scope of the present invention.

Wherein, preferably, the second define layer 113 is formed of a hydrophobic material, such as silicon nitride, and the first define layer 112 is formed of a hydrophilic material, such as silicon oxide.

In the manufacturing method of the pixel define layer of said light-emitting display backplane of embodiments of the present invention, first, the first photosensitive resin layer, the first define layer, the second define layer and the second photosensitive resin layer are sequentially formed on the substrate; the mask is then provided above the second photosensitive resin layer, wherein the mask has a pattern corresponding to respective pixels; exposure amount of photolithography is increased, and both the first and the second photosensitive resin layers are exposed; and then the resin in the regions corresponding to respective pixels in the second photosensitive resin layer is removed, and different etch rates for materials of the first and the second define layers are used to ensure that regions in the first and the second define layers that correspond to respective pixels are etched to form luminescent material filling regions which are wider at bottom and narrower at top. Such luminescent material filling regions can ensure that, during printing, the liquid drops of the luminescent material can be spread within the pixel region of the pixel define layer, and prevented from flowing into an adjacent pixel region. Moreover, the manufacture process of the pixel define layer is simple, and photolithography process only needs to be performed once, so that the number of masks used is reduced, and thus the manufacturing cost is reduced.

It should be noted that, although embodiments of the present invention are described by taking the manufacturing process of the light-emitting layer of the light-emitting display backplane as an example, the application of the present invention is not limited hereto. The present invention can be widely used in situations where patterned thin film is formed by printing techniques, e.g., the manufacturing process of a color filter layer of a color filter substrate, and so on.

Technical features of embodiments of the present invention can be combined with each other arbitrarily as long as there is no conflict.

The examples described above are only specific embodiments of the present invention. However, the protection scope of the present invention is not limited hereto. Modifications and replacements that the person skilled in the art can easily envisage within the technique scope disclosed in the present invention fail into the protection scope of the present invention. Therefore, the protection scope of the present invention is defined by the accompanying claims.

The invention claimed is:

1. A manufacturing method of a pixel define layer of a light-emitting display backplane, wherein, said light-emitting display backplane, comprises a substrate and a pixel define layer provided on said substrate, and said method comprises:

step 1: sequentially forming a first photosensitive resin layer, a first transparent define layer, a second transparent define layer and a second photosensitive resin layer on said substrate;

step 2: providing a mask above said second photosensitive resin layer, wherein said mask has a pattern corresponding to respective pixels step 3: performing exposure, so that both said second photosensitive resin layer and said first photosensitive resin layer below said second photosensitive resin layer are exposed;

step 4: removing resin from regions in said second photosensitive resin layer which correspond to respective pixels, so as to uncover the second define layer;

step 5: performing etching, so as to form openings corresponding to respective pixels, in both the uncovered second define layer and said first define layer below the second define layer, wherein, during etching, etch rate at which said second define layer is etched is smaller than etch rate at which said first define layer is etched, so that the openings in said second define layer are smaller than those in said first define layer.

2. The method according to claim 1, further comprising: removing resin from regions of the first photosensitive resin layer that correspond to respective pixels.

3. The method according to claim 1, wherein, said second define layer is formed of a hydrophobic material.

4. The method according to claim 3, wherein, said second define layer is silicon nitride thin film.

5. The method according to claim 4, wherein, said first define layer is formed of a hydrophilic material.

6. The method according to claim 5, wherein, said first define layer is a silicon oxide thin film.

7. The method according to claim 6, wherein, In the step 5, etching on the uncovered second define layer and the first define layer is performed by means of dry etching.

8. The method according to claim 6, wherein, in the step 5, etching on the uncovered second define layer and the first define layer is performed by means of wet etching, and etch rate of an applied etchant for the silicon nitride thin film is smaller than that for the silicon oxide thin film.

* * * * *